(12) United States Patent
Oshima et al.

(10) Patent No.: US 10,110,241 B1
(45) Date of Patent: Oct. 23, 2018

(54) ANALOG-TO-DIGITAL CONVERTER AND PROBE FOR ULTRASONIC DIAGNOSTIC DEVICE USING THE SAME

(71) Applicant: Hitachi, Ltd., Chiyoda-ku, Tokyo (JP)

(72) Inventors: Takashi Oshima, Tokyo (JP); Taizo Yamawaki, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 15/925,000

(22) Filed: Mar. 19, 2018

(30) Foreign Application Priority Data

Aug. 1, 2017 (JP) .................................. 2017-149146

(51) Int. Cl.
| | |
|---|---|
| *H03M 1/12* | (2006.01) |
| *H03M 1/00* | (2006.01) |
| *H03M 1/06* | (2006.01) |
| *H03M 1/34* | (2006.01) |

(52) U.S. Cl.
CPC ......... *H03M 1/002* (2013.01); *H03M 1/0626* (2013.01); *H03M 1/1245* (2013.01); *H03M 1/34* (2013.01)

(58) Field of Classification Search
CPC .. H03M 1/002; H03M 1/1245; H03M 1/0626; H03M 1/34
USPC ........................................................ 341/155
See application file for complete search history.

(56) References Cited

U.S. PATENT DOCUMENTS

| | | | | |
|---|---|---|---|---|
| 9,538,111 | B2 * | 1/2017 | Yang ....................... | H04N 5/378 |
| 9,712,772 | B2 * | 7/2017 | Kim ......................... | H04N 5/378 |
| 9,832,408 | B2 * | 11/2017 | Murata .............. | H04N 5/37455 |
| 2006/0033652 | A1 | 2/2006 | Nakamori et al. | |
| 2013/0113507 | A1 | 5/2013 | Danesh et al. | |

(Continued)

FOREIGN PATENT DOCUMENTS

| | | |
|---|---|---|
| JP | 2008-72742 A | 3/2008 |
| JP | 2014-175898 A | 9/2014 |

(Continued)

OTHER PUBLICATIONS

Lewis et al., "A 10-b 20-Msample / s Analog-to-Digital Converter", IEEE Journal of Solid-State Circuits, Mar. 1992, pp. 351-358, vol. 27, No. 3.

(Continued)

*Primary Examiner* — Brian Young
(74) *Attorney, Agent, or Firm* — Crowell & Moring LLP

(57) ABSTRACT

An analog-to-digital converter includes a first circuit and a second circuit. The first circuit includes a first quantizer that digitizes an input first analog voltage, has a function of subtracting an analog voltage generated based on the digitalized first value from the first analog voltage, has a function of amplifying a first analog residual voltage which is a result of the subtraction, and a first output drive amplifier that outputs the amplified first analog residual voltage. The second circuit includes a second quantizer that digitizes an input second analog voltage, has a function of subtracting an analog voltage generated based on the digitalized second value from the second analog voltage, has a function of amplifying a second analog-residual voltage which is a result of the subtraction, and a second output drive amplifier that outputs the amplified second analog residual voltage.

15 Claims, 11 Drawing Sheets

(56) References Cited

U.S. PATENT DOCUMENTS

2016/0105193 A1   4/2016   Oshima
2016/0142068 A1   5/2016   Oshima

FOREIGN PATENT DOCUMENTS

JP         2015-198432 A    11/2015
WO     WO 2014/207870 A1   12/2014

OTHER PUBLICATIONS

Oshima et al., "Reference-Free Deterministic Calibration of Pipelined ADC", IEICE Trans. Fundamentals, Feb. 2015, pp. 665-675, vol. E98-A, No. 2, The Institute of Electronics, Information and Communication Engineers.
Ahmed et al., "A 50MS/s 9.9mW Pipelined ADC with 58dB SNDR in 0.18 CMOS Using Capacitive Charge-Pumps", IEEE International Solid-State Circuits Conference, Feb. 10, 2009, pp. 164-165 (three pages total).

* cited by examiner

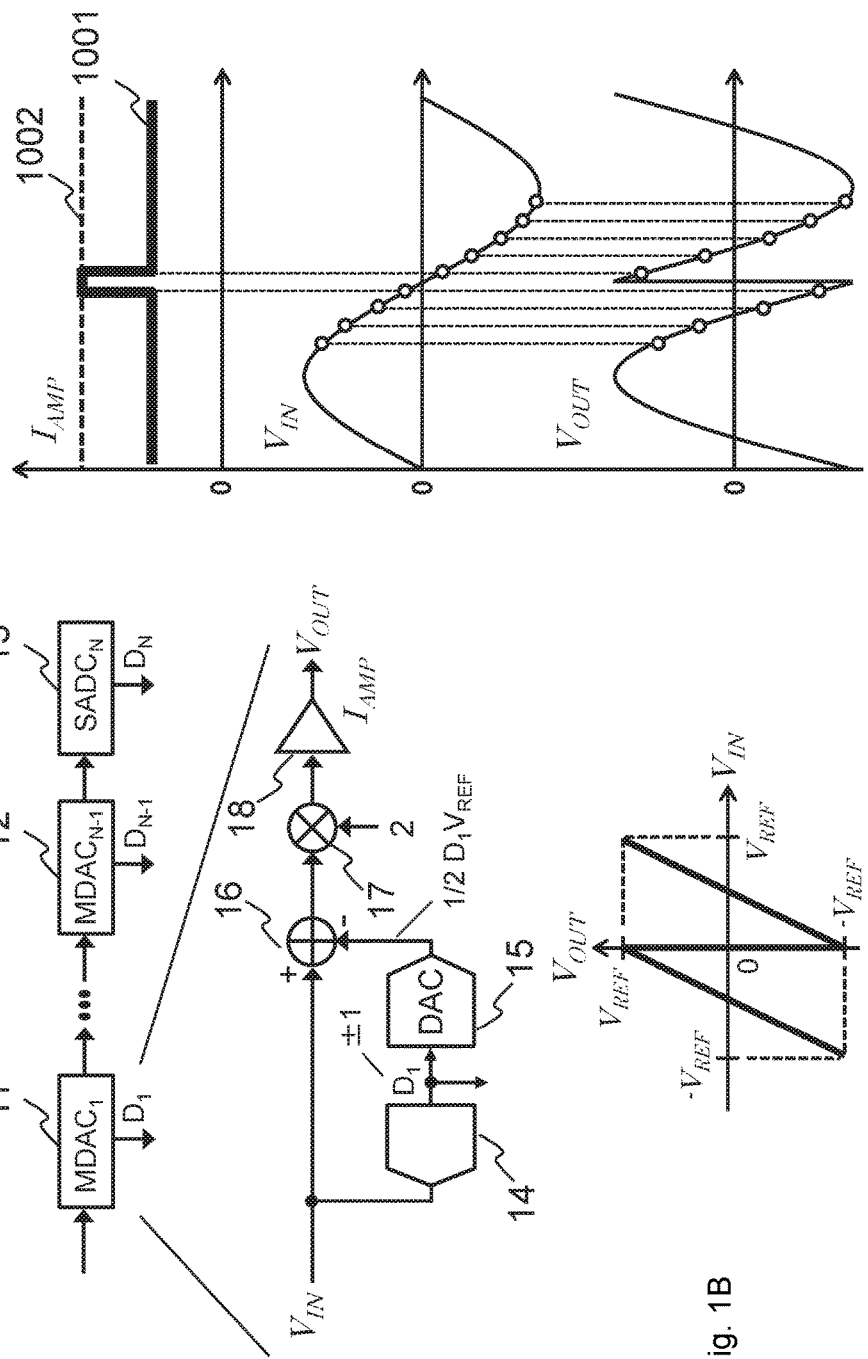

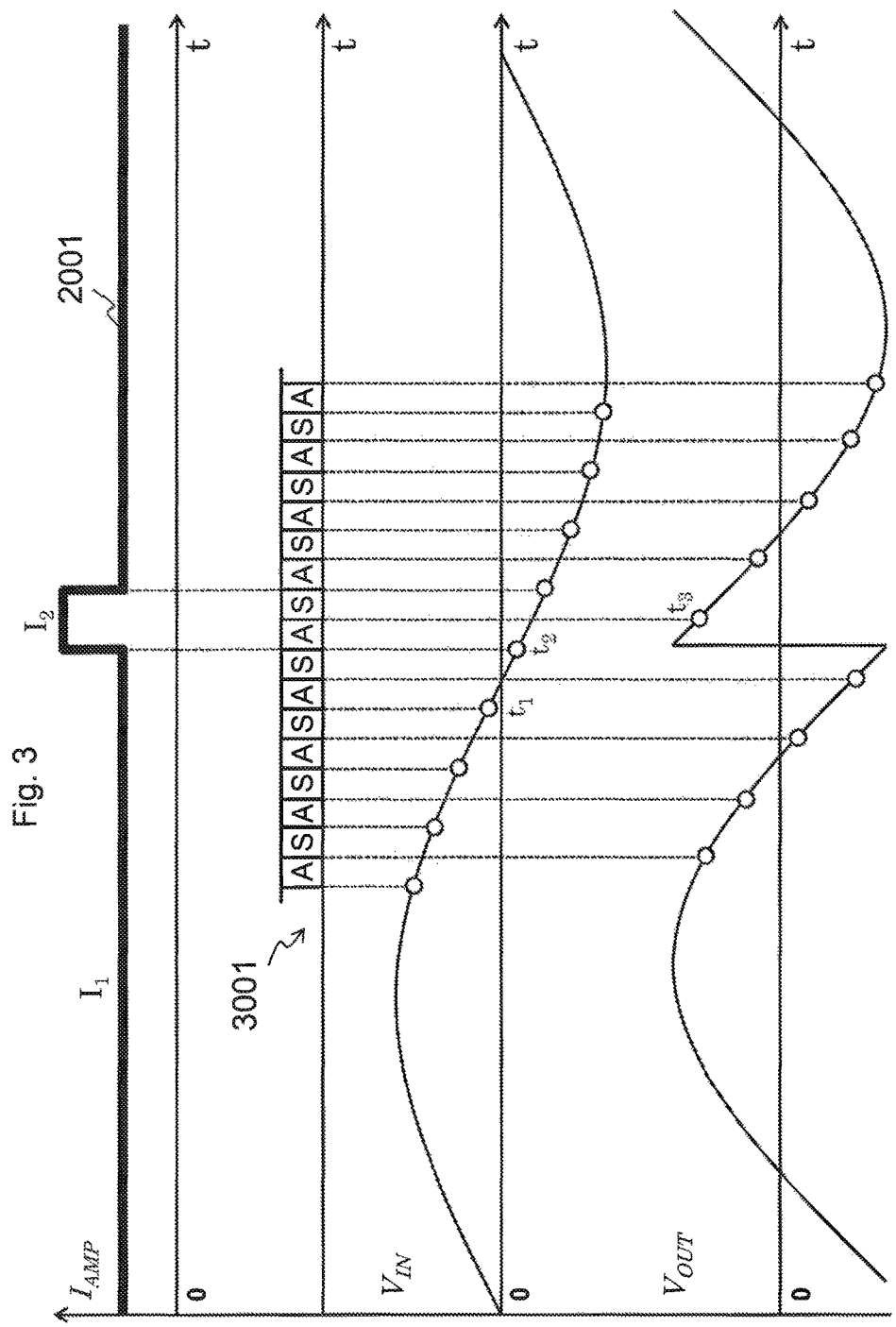

ANALOG-TO-DIGITAL CONVERTER AND PROBE FOR ULTRASONIC DIAGNOSTIC DEVICE USING THE SAME

BACKGROUND

The present invention relates to an analog-to-digital converter having a high conversion rate, high resolution and low power consumption.

In each of medical diagnostic devices such as an ultrasonic diagnostic device or an X-ray CT scanner, a larger number of analog-to-digital converters are demanded to be integrated together in the device with a request for higher resolution of in-vivo images. For that reason, reduction in power consumption per analog-to-digital converter is required.

On the other hand, a large number of sensors each require the analog-to-digital converter for converting an analog signal detected by a sensor device into a digital signal. However, a long-term operation by a small battery, an environmental power generation (energy harvesting) operation, or a wireless power supply operation is desired, and for that purpose, reduction in the power consumption of the analog-to-digital converter is still required.

Further, the medical diagnostic device or the sensor can be increased more in sensitivity and accuracy as the analog-to-digital converter is higher in speed (higher conversion rate) and higher in accuracy (higher resolution).

In view of the above, the analog-to-digital converter having the high conversion rate, high resolution and low power consumption are demanded in the medical diagnostic device, the sensor and a large number of other applications.

A pipelined analog-to-digital converter such as the converter disclosed in S. H. Lewis, H. S. Fetterman, G. F. Gross, Jr., R. Ramachandran and T. R. Viswanathan, "A 10-b 20-M sample/s analog-to-digital converter," IEEE Journal of Solid-State Circuits, Vol. 27, pp. 351-358, March 1992 has been known as an analog-to-digital conversion method capable of achieving both of a high conversion rate and a high resolution at comparatively small power consumption.

In addition, it has been known that a digital correction technology can reduce the power consumption of the pipelined analog-to-digital converter. This is because analog accuracy which is insufficient when an analog circuit configuring the analog-to-digital converter is reduced in power consumption can be compensated by a digital arithmetic process. The digital correction technology has been known by, for example, WO2014/207870, Japanese Unexamined Patent Application Publication No. 2014-175898, T. Oshima and T. Yamawaki, "Reference-free deterministic calibration of pipelined ADC," IEICE Transactions on Fundamentals of Electronics, Communications and Computer Sciences, pp. 665-675 (2015), and so on.

In addition, as a technology for simplifying the analog circuit configuring the pipelined analog-digital converter to reduce the power consumption, a "passive amplification type" pipelined analog-digital converter disclosed in Japanese Unexamined Patent Application Publication No. 2015-198432 and Imran Ahmed, Jan Mulder, David A. Johns, "A 50 MS/s 9.9 mW Pipelined ADC with 58 dB SNDR in 0.18 um CMOS Using Capacitive Charge-Pumps", 2009 IEEE International Solid-State Circuits Conference, pp. 164-165, February 2009 has been known.

Also, in Japanese Unexamined Patent Application Publication No. 2008-072742, a bias current of the analog circuit configuring the pipelined analog-to-digital converter is switched to reduce the power consumption. In other words, a large current flows when the conversion rate is high and a small current flows when the conversion rate is low. However, with respect to a given conversion rate, the same current flows regardless of an input signal and the current is not switched to a minimum current according to the input signal.

With the adoption of the digital correction technology and the passive amplification type, reduction in the power consumption of the pipelined analog-to-digital converter is performed, but further reduction in the power consumption is demanded in the medical diagnostic devices, the sensors, and a large number of other applications. For example, the conventional pipelined analog-to-digital converters may exceed a level of the power consumption required by the medical diagnostic devices, the sensors, and a large number of other applications.

SUMMARY OF THE INVENTION

An object of the present invention is to reduce a level of power consumption of a pipelined analog-to-digital converter.

According to a first aspect of the present invention, there is provided an analog-to-digital converter including a first circuit and a second circuit. The first circuit includes a first quantizer that digitizes an input first analog voltage, has a function of subtracting an analog voltage generated based on the digitalized first value from the first analog voltage, has a function of amplifying a first analog residual voltage which is a result of the subtraction, and a first output drive amplifier that outputs the amplified first analog residual voltage. The second circuit includes a second quantizer that digitizes an input second analog voltage, has a function of subtracting an analog voltage generated based on the digitalized second value from the second analog voltage, has a function of amplifying a second analog residual voltage which is a result of the subtraction, and a second output drive amplifier that outputs the amplified second analog residual voltage. The first circuit further includes a first detection control circuit, and the first detection control circuit detects a change in the digitized first value, and increases a bias current of the first output drive amplifier at a timing of detecting the change.

According to another aspect of the present invention, there is provided an analog-to-digital converter including a first circuit and a second circuit. The first circuit includes a first quantizer that digitizes an input first analog voltage, has a function of subtracting an analog voltage generated based on the digitalized first value from the first analog voltage, has a function of amplifying a first analog residual voltage which is a result of the subtraction, and a first output drive amplifier that outputs the amplified first analog residual voltage. The second circuit includes a second quantizer that digitizes an input second analog voltage, has a function of subtracting an analog voltage generated based on the digitalized second value from the second analog voltage, has a function of amplifying a second analog residual voltage which is a result of the subtraction, and a second output drive amplifier that outputs the amplified second analog residual voltage. The first circuit further includes a first detection control circuit, and the first detection control circuit detects a change in the digitized first value, and replaces a conversion result at a sampling point corresponding to the timing of detecting the change with a value interpolated by using a conversion result at a surrounding sampling point.

According to still another aspect of the present invention, there is provided a probe for an ultrasonic diagnostic device which converts a received acoustic wave signal into an electric signal and outputs the electric signal as a digital signal. The probe for an ultrasonic diagnostic device includes a plurality of channels, each of which includes a probe that receives the acoustic wave signal and converts the received acoustic wave signal into an analog electric signal, an analog front end circuit that processes the analog electric signal, and an analog-to-digital converter that converts the analog electric signal into a digital electric signal. Each of the analog-to-digital converters includes a first circuit and a second circuit. The first circuit includes a first quantizer that digitizes an input first analog voltage, a first subtraction circuit that subtracts an analog voltage generated based on the digitalized first value from the first analog voltage, and a first amplifier that amplifies an output of the first subtraction circuit and outputs the amplified output as a second analog voltage. The second circuit includes a second quantizer that digitizes the input second analog voltage, a second subtraction circuit that subtracts an analog voltage generated based on the digitalized second value from the second analog voltage, and a second amplifier that amplifies an output of the second subtraction circuit and outputs the amplified output. The first circuit further includes a first detection control circuit that detects a timing of changing the digitalized first value. The probe includes at least one of a current control function of increasing a current to be supplied to the first amplifier based on the timing and a result replacement function of replacing an analog-to-digital conversion result with another based on the timing.

The power consumption of the pipelined analog-to-digital converter can be reduced.

BRIEF DESCRIPTION OF THE DRAWINGS

FIGS. 1A, 1B, and 1C are conceptual diagrams showing main points according to an embodiment;

FIG. 3 is a waveform diagram showing a detail according to the first embodiment;

DETAILED DESCRIPTION OF THE PREFERRED EMBODIMENT

Figure 2A:
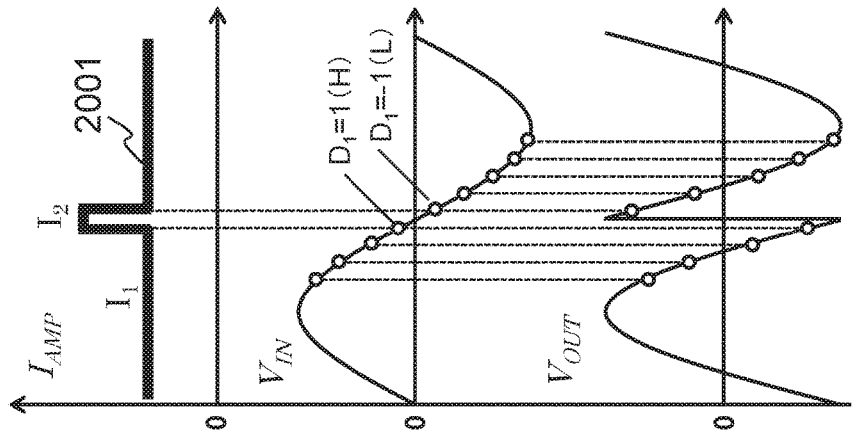
FIGS. 2A and 2B are a circuit block diagram and a waveform diagram according to a first embodiment.

In the configuration of the invention described below, the same reference numerals are used for the same parts or parts having similar functions in different drawings, and a redundant description may be omitted.

The notations such as "first", "second", and "third" in the present specification and the like are attached to identify components, and do not necessarily limit the number or order. The number for identifying the component is used for each context and the number used in one context does not necessarily indicate the same configuration in other contexts. The component identified by a certain number does not preclude the function of the component identified by other numbers.

In order to facilitate understanding of the invention, a position, size, shape, range, or the like of each component shown in the drawings or the like may not express an actual position, size, shape, range, or the like. For that reason, the embodiments are not necessarily limited to the position, size, shape, range, or the like described in drawings and the like.

The main points of the embodiments to be described below are as follows: In a large number of systems, an input signal frequency is sufficiently lower than the conversion rate. In that case, focusing on a fact that a large drive force is required for an amplifier configuring the pipelined analog-to-digital converter only when an input signal voltage crosses zero, a timing at which the input signal voltage crosses zero is detected, and a bias current of the amplifier is increased only at that time to increase a driving force of the amplifier.

The outline of the operation of the pipelined analog-to-digital converter and a viewpoint of the present embodiment will be described with reference to FIGS. 1A, 1B, and 1C. As shown in a circuit block diagram of FIG. 1A, the pipelined analog-to-digital converter is configured such that MDACs (multiplying DACs) 11 and 12 are connected in series with each other, and a final stage is terminated by an SADC (Sub ADC) 13. In the case of the pipelined analog-to-digital converter of 1 bit/stage suitable for low power consumption, a 1-bit MDAC and a 1-bit SADS are employed. The 1-bit SADC is a positive-negative determination unit.

For example, in the case of a passive amplification 1-bit type MDAC disclosed in Japanese Unexamined Patent Application Publication No. 2015-198432, each MDAC includes a positive-negative determination unit (or code determination unit) 14, a 1-bit DAC 15, a subtracter 16, a double multiplier 17, and a buffer amplifier 18. The positive-negative determination unit 14 outputs +1 if an input voltage $V_{IN}$ of the MDAC is positive and −1 if the input voltage $V_{IN}$ is negative, which is a digital output of the MDAC as $D_k$ (a case of a kth MDAC). $D_k$ is converted into an analog voltage $½*D_k*V_{REF}$ by the 1-bit DAC 15. In this case, $V_{REF}$ is a reference voltage of the analog-to-digital converter.

Further, the subtracter 16 obtains a difference voltage between the input voltage $V_{IN}$ and the analog voltage $½*D_k*V_{REF}$. Further, the double multiplier 17 amplifies the difference voltage twice. The buffer amplifier 18 transmits the amplified voltage to the MDAC of a next stage as an MDAC output voltage $V_{OUT}$. The buffer amplifier 18 requires driving power to charge and discharge a sampling capacitance and a parasitic capacitance of the next stage MDAC while an input is high impedance and a gain is about 1 time. The buffer amplifier 18 can be realized by, for example, a source follower circuit. It should be noted that the 1-bit DAC 15, the subtracter 16, and the double multiplier 17 can be equivalently and integrally realized with the use of only a capacitive element, an MOS switch, and a power supply voltage as disclosed in Japanese Unexamined Patent Application Publication No. 2015-198432. An input-output relationship of the MDAC is expressed by the following Expression (1).

[Ex. 1]

$$V_{OUT} = 2\left(V_{IN} - \frac{1}{2}D_k \cdot V_{REF}\right) \quad (1)\text{ Formula}$$

Digital outputs $D_1$ to $D_N$ are obtained by allowing the respective MDACs to repeat the above operation. The analog-to-digital conversion result $D_{OUT}$ is obtained by calculation of the following Expression (2) with the use of those digital outputs.

[Ex. 2]

$$D_{OUT} = \frac{1}{2}D_1 + \frac{1}{2G_1}D_2 + \frac{1}{2G_1 \cdot G_2}D_3 + \quad (2)\text{ Formula}$$

$$\Lambda \frac{1}{2G_1 \cdot G_2 \Lambda G_{N-2} \cdot G_{N-1}} \cdot D_N \equiv \sum_{k=1}^{N} W_k \cdot D_k$$

In this example, $G_k$ is a gain of the kth MDAC and is about 2. In the case of $G_k=2$, weighting factors $W_k$ of the respective $D_k$ are $\frac{1}{2}^k$. In fact, since $G_k$ is deviated from 2, those weighting coefficients are strictly searched and obtained, and the calculation of Expression (2) is performed based on the obtained weighting coefficients.

The input-output relationship of Expression (1) is shown in FIG. 1B with an axis of abscissa as a time. In other words, the MDAC output voltage increases negatively (that is, becomes closes to $-V_{REF}$) when the input voltage of the MDAC is positive and near zero. On the other hand, when the input voltage of the MDAC is negative and near zero, the MDAC output voltage increases positively (becomes close to $+V_{REF}$). For that reason, as shown in FIG. 1C, when the input signal frequency is sufficiently lower than the conversion rate of the analog-to-digital converter, the MDAC output voltage $V_{OUT}$ changes greatly only at a timing when the input voltage $V_{IN}$ crosses zero.

In other words, large driving capability is required for the buffer amplifier 18 only at the timing when the input signal voltage crosses zero. Therefore, the bias current of the buffer amplifier which determines the driving capability of the buffer amplifier 18 is to be increased originally only at the above timing (inherently necessary current 1001). However, up to now, a constant large current (actual current 1002) has been allowed to flow regardless of the input signal voltage. Therefore, in the present embodiment, the bias current is increased at the above timing, to thereby reduce the power consumption of the analog-to-digital converter.

First Embodiment

A first embodiment of the present invention will be described with reference to FIGS. 2A and 2B. A pipelined analog-to-digital converter is configured by a serial connection of the passive amplification type 1-bit MDAC 21 and 12 and the 1-bit SADC 13 at a final stage.

In addition to the configuration of the MDAC 11 in FIG. 1A, as shown in FIG. 2A, a detection unit 22 and a current control unit 23 are added to the first stage MDAC 21. The detection unit 22 receives an output $D_1$ of the positive-negative determination unit 14, and outputs H (high) only when the output $D_1$ changes between a previous sample and a current sample. In other words, the detection unit 22 outputs H if $D_1$(previous time)=+1 and $D_1$(current time)=−1, outputs H if $D_1$(previous time)=−1 and $D_1$(current time)=+1, outputs L (low) if $D_1$(previous time)=+1 and $D_1$(current time)=+1, and outputs L if $D_1$(previous time)=−1 and $D_1$(current time)=−1.

As a result, the detection unit 22 outputs H only at the timing when the input voltage of the MDAC 21 crosses zero. For example, in FIG. 2B, an input voltage waveform crosses zero from positive to negative and $D_1$(previous time)=+1 and $D_1$(current time)=−1 are satisfied at that timing. Therefore, the detection unit 22 outputs H. In the other time zone, the detection unit 22 outputs L.

The current control unit 23 receives the output of the detection unit 22, sets a bias current value $I_{AMP}$ of the buffer amplifier 18 to a small current value $I_1$ if the output is L, and sets the bias current value of the buffer amplifier 18 to a large current value $I_2$ if the output is H. Therefore, the bias current value of the buffer amplifier 18 becomes the large current value $I_2$ only at the above timing, as indicated by a current value 2001 shown in an upper graph in FIG. 2B, and the bias current value of the buffer amplifier 18 becomes the small current value $I_1$ in the other time zone. As a result, the driving capability of the buffer amplifier 18 is enhanced only at the above timing and can respond to a large transition of the output voltage $V_{OUT}$ shown in a lower graph of FIG. 2B. The buffer amplifier 18 is, for example, a source follower circuit.

The detection unit 22 can be realized by, for example, a one-sample delay unit 221 and an exclusive OR 222. $D_1$ (current time) is input to an upper input of the exclusive OR 222. Also, $D_1$ (previous time) is input to a lower input of the exclusive OR 222 by the effect of one-sample time delay by the one-sample delay unit 221. $D_1$=+1 is represented by an H (high) voltage and $D_1$=−1 is represented by an L (low) voltage. The exclusive OR 222 outputs H when its two inputs are (H, L) or (L, H), and output L when the two inputs are (L, L) or (H, H). Therefore, the operation of the detection unit 22 can be realized.

The other operation is the same as that described in FIGS. 1A to 1C, and the operation represented by Expression (1) is performed. Since the pipelined analog-to-digital converter according to the present embodiment operates with the small current value $I_2$ in most of the time, the power consumption is low. Specific values of the large current value $I_2$ and the small current value $I_1$ may be determined based on the performance required for the circuit and the power consumption constraint.

Figure 2B:
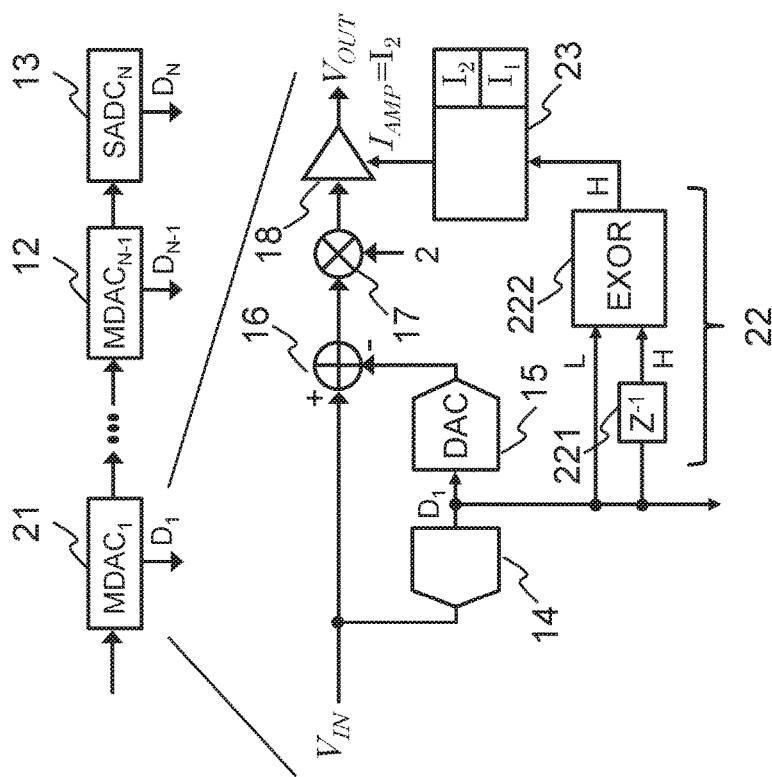

FIG. 3 shows a more detailed timing diagram of FIG. 2B. In a real circuit, the MDAC operates in an operation mode 3001 and alternately repeats a sampling period (indicated as "S") and an amplification period (indicated as "A"). $V_{IN}$ in FIG. 2B corresponds to an input voltage at the moment of each sampling period end indicated by each open circle. At the moment, the positive-negative determination unit 14 determines a value of $D_1$. Further, $V_{OUT}$ is generated during a subsequent amplification period.

Since $V_{IN}$ is positive at a time $t_1$ in FIG. 3, $D_1$=+1 is satisfied. On the other hand, since $V_{IN}$ is negative at a next time $t_2$, $D_1$=−1 is satisfied. Since $D_1(t1)$=+1 and $D_1(t_2)$=−1 are satisfied, the detection unit 22 outputs H for one conversion cycle from the time $t_2$ and the bias current $I_{AMP}$ of the buffer amplifier 18 is increased to $I_2$. At that time, the MDAC output $V_{OUT}$ needs to respond until a time $t_3$ which is an amplification period end timing, and is realized by the above current increase.

Second Embodiment

Figure 4A:
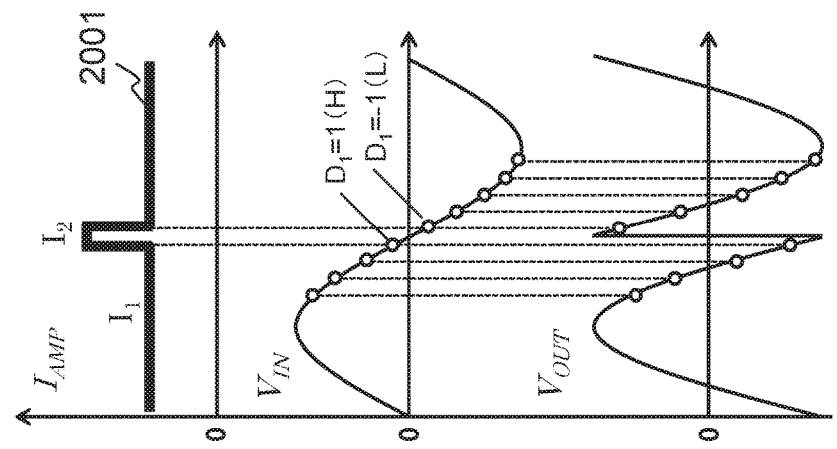
FIGS. 4A and 4B are a circuit block diagram and a waveform diagram according to a second embodiment.
Figure 4B:
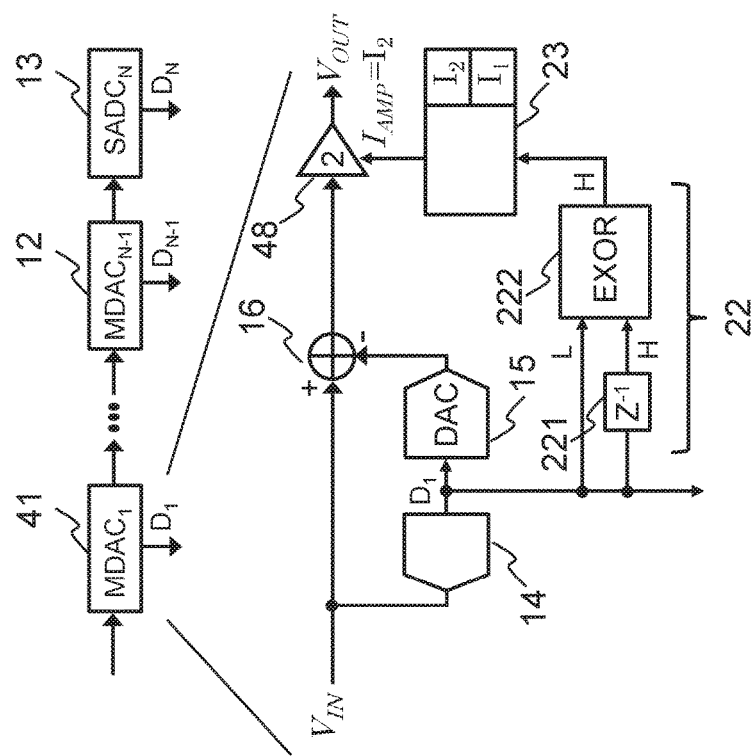

A second embodiment of the present invention will be described with reference to FIGS. 4A, 4B, and 4C. The first embodiment is applied to the passive amplifier type 1-bit MDAC 21 whereas the present embodiment is applied to an operational amplifier type 1-bit type MDAC 41 which has widely been popularized.

The difference from FIGS. 2A and 2B resides in that the double multiplier 17 is eliminated and instead the buffer amplifier 18 is replaced with a double amplification amplifier 48. For that reason, the double amplification amplifier 48 is to be controlled by the current control unit 23. The double amplification amplifier 48 is realized by a capacitance feedback circuit of the operational amplifier. The other operation is the same as that of the first embodiment, and the effects of the embodiment are the same.

Third Embodiment

Figure 5A:
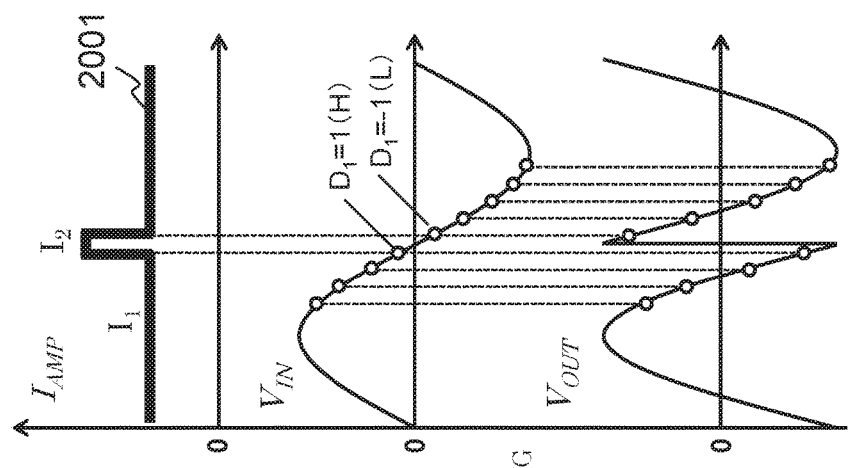
FIGS. 5A and 5B are a circuit block diagram and a waveform diagram according to a third embodiment.

A third embodiment of the present invention will be described with reference to FIGS. 5A and 5B. In addition to the first embodiment, as shown in FIG. 5A, an LPF 52 (low-pass filter) for input signal band limit is added to a prestage of a pipelined analog-to-digital converter. In addition, a passband of the LPF 52 can be variably set according to a band control signal FCONT. Further, a small current set value I1 of a current control unit 53 is variable according to the band control signal FCONT. In other words, the present embodiment is characterized in that a small bias current $I_1$ flowing in most time zones other than the zero cross of the input voltage is linked with the setting of the input signal band.

Figure 5B:
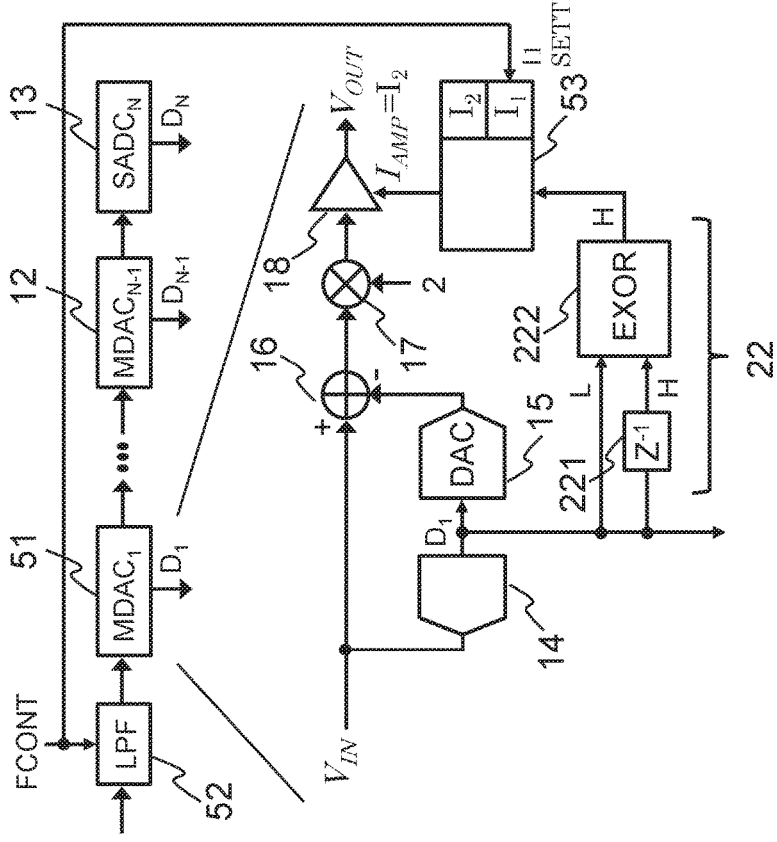

As shown in FIG. 5B, a transition step amount of an output voltage waveform $V_{OUT}$ in the time zone other than the zero cross of the input voltage waveform $V_{IN}$ is proportional to the transition step amount of the input voltage waveform, that is, an input signal frequency. Since an upper limit of the input signal frequency is restricted by the band control signal, a driving force required by the buffer amplifier 18 in the time zone other than the zero cross of the input voltage is determined according to the passband set according to the band control signal. For that reason, as described above, the small current set value $I_1$ is interlocked with the band control signal. Therefore, according to the present embodiment, the bias current of the buffer amplifier 18 can be set to a minimum value. The other operation and effects are the same as those of the first embodiment.

Fourth Embodiment

Figure 6:
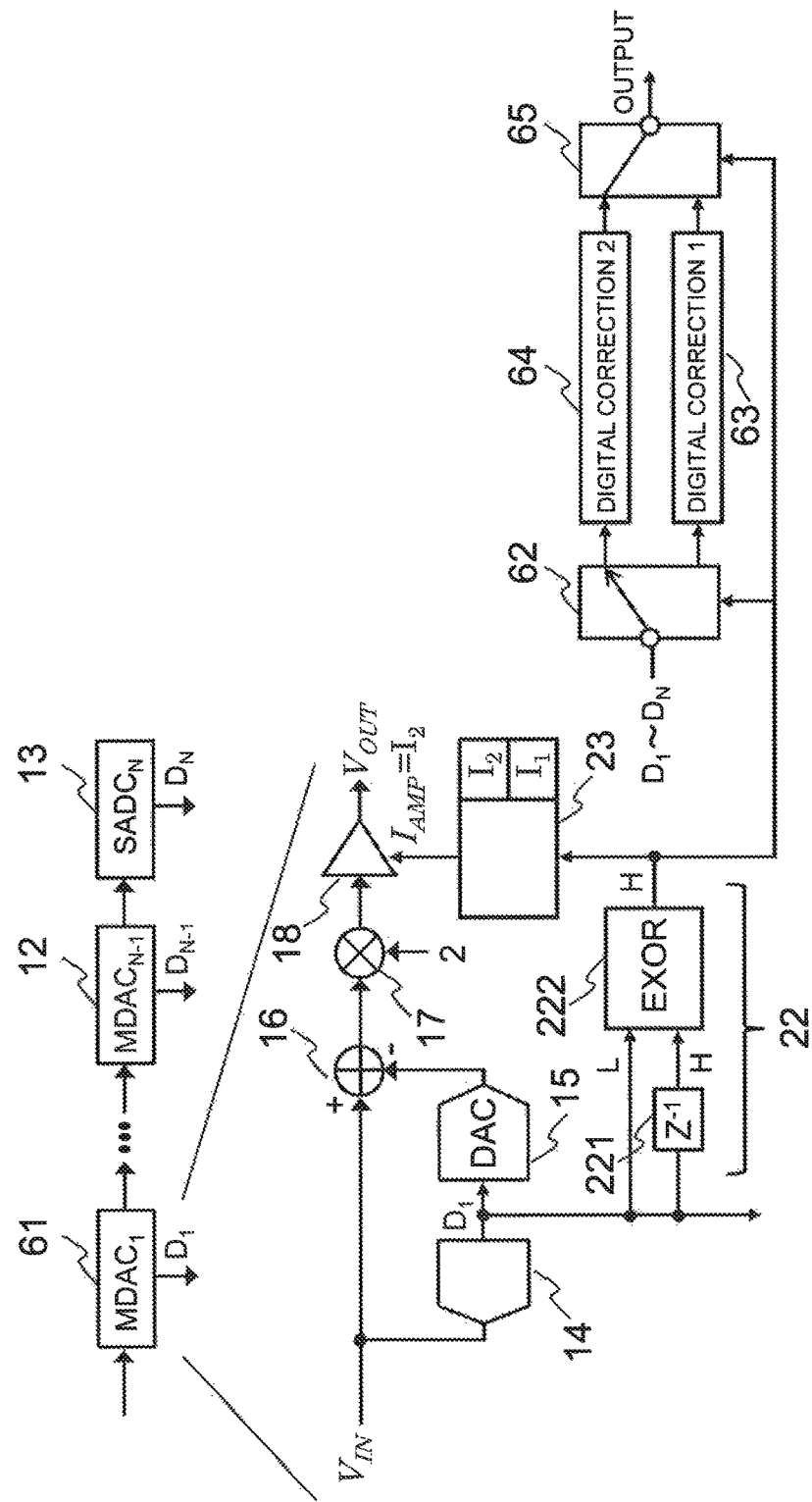
FIG. 6 is a circuit block diagram according to a fourth embodiment.

A fourth embodiment of the present invention will be described with reference to FIG. 6. In the present embodiment, a digital correction unit is added to the first embodiment. As described above, when a gain of each MDAC is deviated from twice, since a weighting coefficient $W_k$ does not become equal to $\frac{1}{2}^k$, it is desirable to search for an accurate weighting coefficient in the digital correction unit and to further obtain an analog-to-digital conversion result $D_{OUT}$ by the calculation of Expression (2) with the use of the accurate weighting coefficient.

For example, when a source follower circuit is applied as the buffer amplifier 18, since a gain of the source follower circuit is slightly smaller than 1, a gain of the MDAC is slightly smaller than twice. For that reason, there is a need to search for a weighting coefficient by the digital correction unit.

Furthermore, since the gain of the source follower circuit varies depending on a bias current value of the source follower circuit, when the bias current value of the source follower circuit is switched to $I_2$ by the current control unit 23, a corresponding weighting factor should also be switched accordingly.

Therefore, the present embodiment is provided with a first digital correction unit 63 that searches for the weighting coefficient corresponding to the bias current $I_1$ and performs the calculation of Expression (2) with the use of the searched weighting coefficient, and a second digital correction unit 64 that searches for the weighting coefficient corresponding to the bias current $I_2$ and performs the calculation of Expression (2) with the use of the searched weighting coefficient.

The digital outputs $D_1$ to $D_N$ of the respective MDACs and SADC 13 are input to the first digital correction unit 63 or the second digital correction unit 64 by a path switching unit 62 according to an output of the detection unit 22. In other words, $D_1$ to $D_N$ are input to the first digital correction unit 63 if the output of the detection unit 22 is L, and $D_1$ to $D_N$ are input to the second digital correction unit 64 if the output of the detection unit 22 is H. As a result, each weighting coefficient corresponding to the bias current value I1 is normally searched for in the first digital correction unit 63, and each weighting coefficient corresponding to the bias current value I2 is normally searched for in the second digital correction section 64. Since the characteristic (gain) of the $MDAC_1$ also affects the values of the weighting coefficients $W_2$ to $W_N$, $D_2$ to $D_N$ are also required in the digital correction units 63 and 64 as described above.

The selector 65 selects any one of an output of the first digital correction unit 63 and an output of the second digital correction unit 64 according to an output of the detection unit 22 and outputs the selected output as a final analog-to-digital conversion result. The output of the first digital correction unit 63 is selected if the output of the detection unit 22 is L and the output of the second digital correction unit 64 is selected if the output of the detection unit 22 is H.

Fifth Embodiment

Figure 7A:
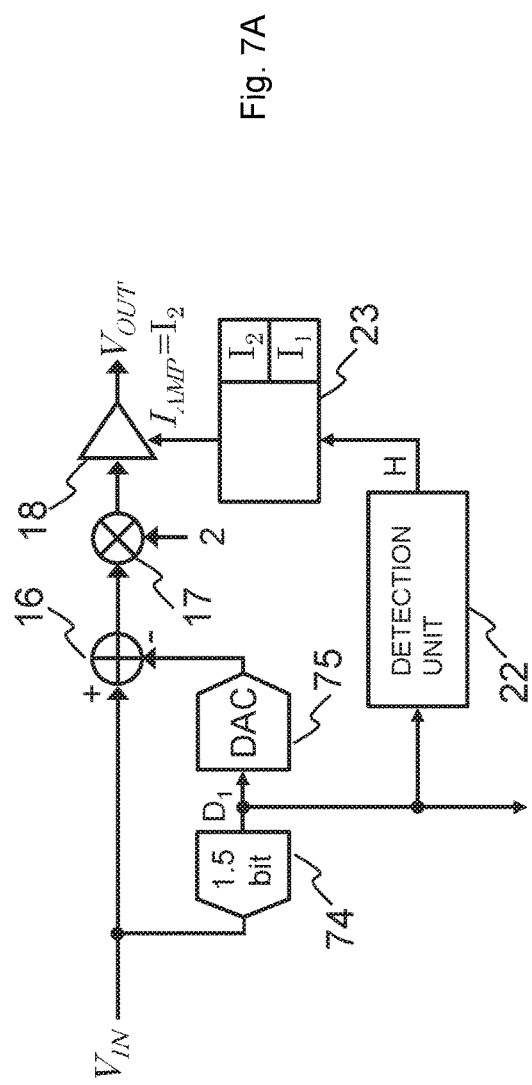
FIGS. 7A and 7B are a circuit block diagram and a waveform diagram according to a fifth embodiment.

A fifth embodiment of the present invention will be described with reference to FIGS. 7A and 7B. The first embodiment is applied to the passive amplification type 1-bit MDAC whereas the present embodiment is applied to a passive amplification type 1.5-bit MDAC.

The 1-bit MDAC of the first embodiment employed the positive-negative determination unit 14. The positive-negative determination unit 14 corresponds to a binary quantizer, that is, a 1-bit quantizer. On the other hand, as shown in FIG. 7A, the 1.5-bit MDAC of the present invention employs a ternary quantizer, that is, a 1.5-bit quantizer 74. Also, the 1.5-bit MDAC of the present invention employs a 3-value DAC, that is, a 1.5-bit DAC 75 accordingly.

The 1.5-bit quantizer 74 outputs $D_1=+1$ if an input voltage $V_{IN}$ of the MDAC is higher than $V_{REF}/4$, the 1.5-bit quantizer 74 outputs $D_1=-1$ if $V_{IN}$ is lower than $V_{REF}/4$, and the 1.5-bit quantizer 74 outputs $D_1=0$ if $V_{IN}$ is between $V_{REF}/4$ and $-V_{REF}/4$. Also, the 1.5-bit DAC 75 generates an analog voltage $\frac{1}{2}*D1*V_{REF}$ according to those three types of D1. The operation and effects are the same as those in the first embodiment, and the input-output relationship of the MDAC is represented by Expression (1) and the analog-to-digital conversion result is represented by Expression (2).

Figure 7B:
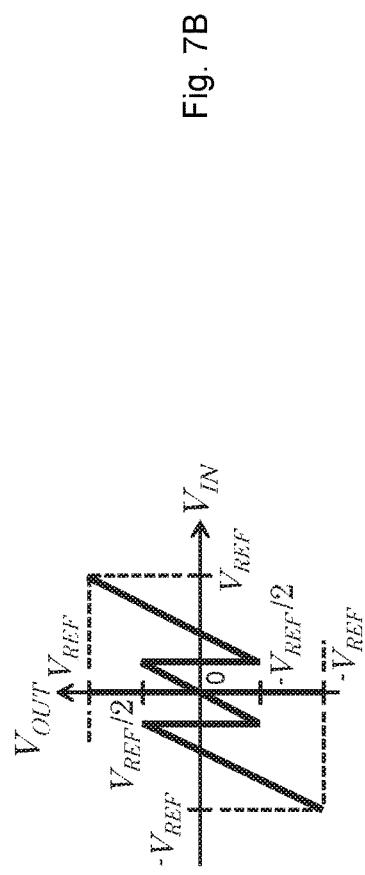

The input-output relationship of the MDAC is shown in FIG. 7B. The output voltage $V_{OUT}$ of the MDAC greatly changes at a timing when the input voltage $V_{IN}$ of the MDAC crosses $\pm V_{REF}/4$, that is, at a timing when the value of $D_1$ changes. Therefore, the detection unit 72 detects a timing at which $D_1$ changes from +1 to 0, a timing at which $D_1$ changes from 0 to +1, a timing at which $D_1$ changes from −1 to 0, or a timing at which $D_1$ changes from 0 to −1, and outputs H when detecting any one of those timings.

Incidentally, a 1.5-bit DAC 75, a subtracter 16, and a double multiplier 17 can be equivalently and integrally realized with the use of only a capacitive element, a MOS switch, and a power supply voltage, as illustrated in Japanese Unexamined Patent Application Publication No. 2015-198432.

Sixth Embodiment

Figure 8A:
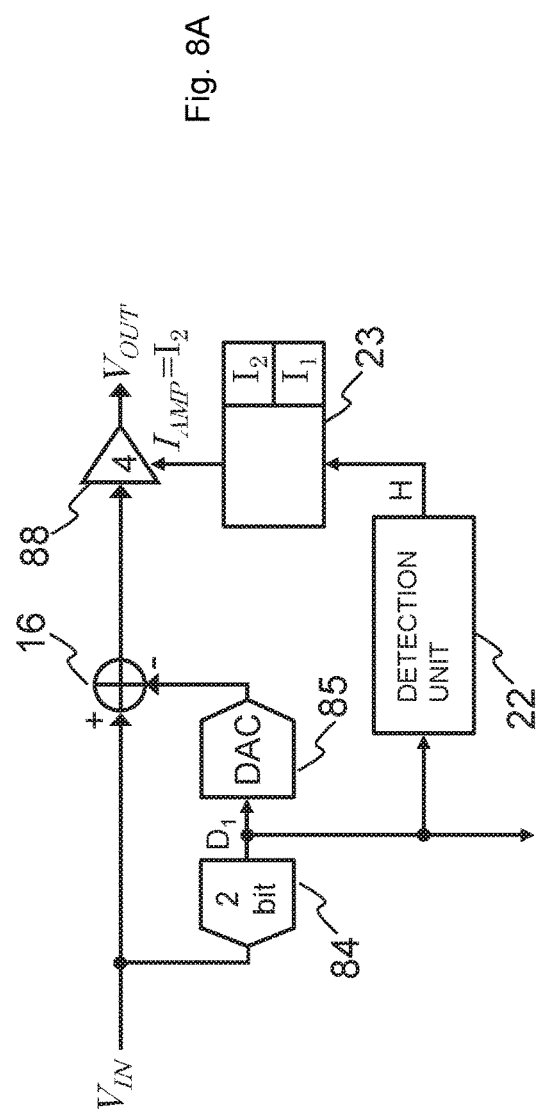
FIGS. 8A and 8B are a circuit block diagram and a waveform diagram according to a sixth embodiment.

A sixth embodiment of the present invention will be described with reference to FIGS. 8A and 8B. The second embodiment is applied to the operational amplifier type 1-bit MDAC whereas the present embodiment is applied to an operational amplifier 2-bit MDAC.

The 2-bit MDAC of the present embodiment employs a quaternary quantizer, that is, a 2-bit quantizer 84. Also, the 2-bit MDAC employs a 4-level DAC, that is, a 2-bit DAC 85, accordingly.

The 2-bit quantizer 84 outputs $D_1=+3$ if an input voltage $V_{IN}$ of the MDAC is higher than $V_{REF}/2$, outputs D1=+1 if $V_{IN}$ is between $V_{REF}/2$ and 0, outputs D1=−1 if $V_{IN}$ is between 0 and $-V_{REF}/2$, and outputs D1=−3 if $V_{IN}$ is lower than $-V_{REF}/2$. In addition, the 2-bit DAC 85 generates outputs an analog voltage $\frac{1}{4}*D1*V_{REF}$ according to those four types of $D_1$.

Although the operation and effects are the same as those in the second embodiment, since the amplifier is a quadruple amplifier 88, an input-output relationship of the MDAC is represented by Expression (3) and the analog-to-digital conversion result is represented by Expression (4).

[Ex. 3]

$$V_{OUT} = 4\left(V_{IN} - \frac{1}{4}D_k \cdot V_{REF}\right) \quad \text{(3) Formula}$$

[Ex. 4]

$$D_{OUT} = \frac{1}{4}D_1 + \frac{1}{4G_1}D_2 + \frac{1}{4G_1 \cdot G_2}D_3 + \\ \Lambda \frac{1}{4G_1 \cdot G_2 \Lambda G_{N-2} \cdot G_{N-1}} \cdot D_N \equiv \sum_{k=1}^{N} W_k \cdot D_k \quad \text{(4) Formula}$$

Figure 8B:
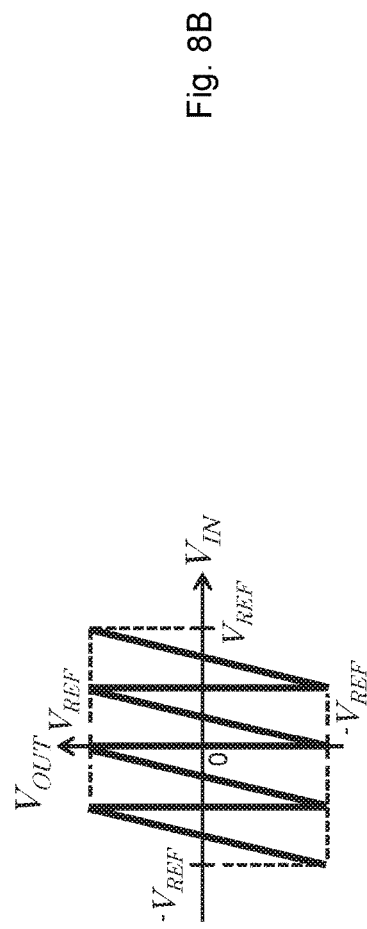

The input-output relationship of the MDAC is shown in FIG. 8B. The output voltage $V_{OUT}$ of the MDAC greatly changes at a timing when the input voltage $V_{IN}$ of the MDAC crosses $\pm V_{REF}/2$, or 0, that is, a timing when the value of $D_1$ changes. Therefore, the detection unit 82 detects a timing when D1 changes from +3 to +1, a timing when D1 changes from +1 to +3, a timing when D1 changes from +1 to −1, a timing when D1 changes from −1 to +1, a timing when D1 changes from −1 to −3, or a timing when D1 changes from −3 to −1, and outputs H when detecting any one of those timings.

Seventh Embodiment

Figure 9:
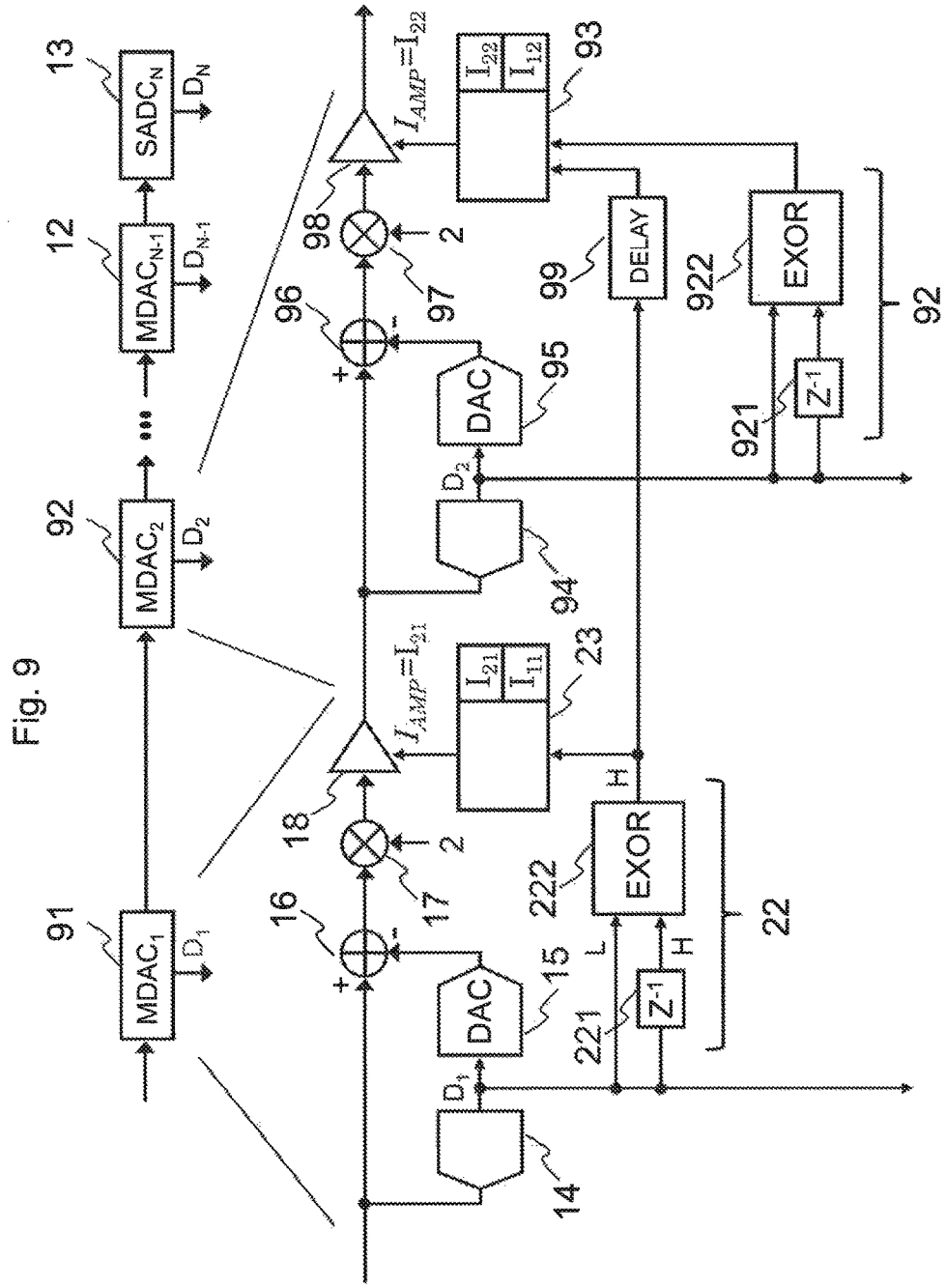
FIG. 9 is a circuit block diagram according to a seventh embodiment.

A seventh embodiment of the present invention will be described with reference to FIG. 9. In the present embodiment, the same current control as that of the first stage MDAC 91 is also applied to a second stage MDAC 92. As with the first stage MDAC 91, the MDAC 92 includes a positive-negative determination unit 94 and a 1-bit DAC 95. The current control is implemented by a detection unit 92 using a 1-sample delay unit 921 and an exclusive OR 922 and a current control unit 93 as in the case of the MDAC 91 of the first stage.

In the present embodiment, the detection result of the detection unit 22 in the first stage MDAC 91 is also transmitted to the current control unit 93 in the second stage MDAC 92. When one of an output of the detection unit 22 and an output of the detection unit 92 becomes H, the current control unit 93 increases a bias current value of the buffer amplifier 98 to $I_{22}$. Since an output voltage of the MDAC 92 of the second stage greatly changes even at a timing when the input voltage of the MDAC 92 greatly changes, that is, at a timing when the input voltage of the MDAC 91 crosses zero, in addition to a timing when the input voltage of the MDAC 92 crosses zero, the current control described above is performed. Since the operation of the second stage MDAC 92 is delayed from the operation of the first stage MDAC 91 by ½ conversion cycle, a delay unit 99 that causes a delay by ½ conversion cycle is inserted and synchronized in the circuit.

Likewise, the same current control as that of the first stage MDAC 91 can be applied to MDACs of the third and subsequent stages. However, since a load of a buffer amplifier increases toward the preceding stage, a power consumption reduction effect increases toward the preceding stage. It is a preferable design method to introduce the current control of the buffer amplifier to the first stage MDAC or the first stage and second stage MDACs.

Eighth Embodiment

Figure 10:
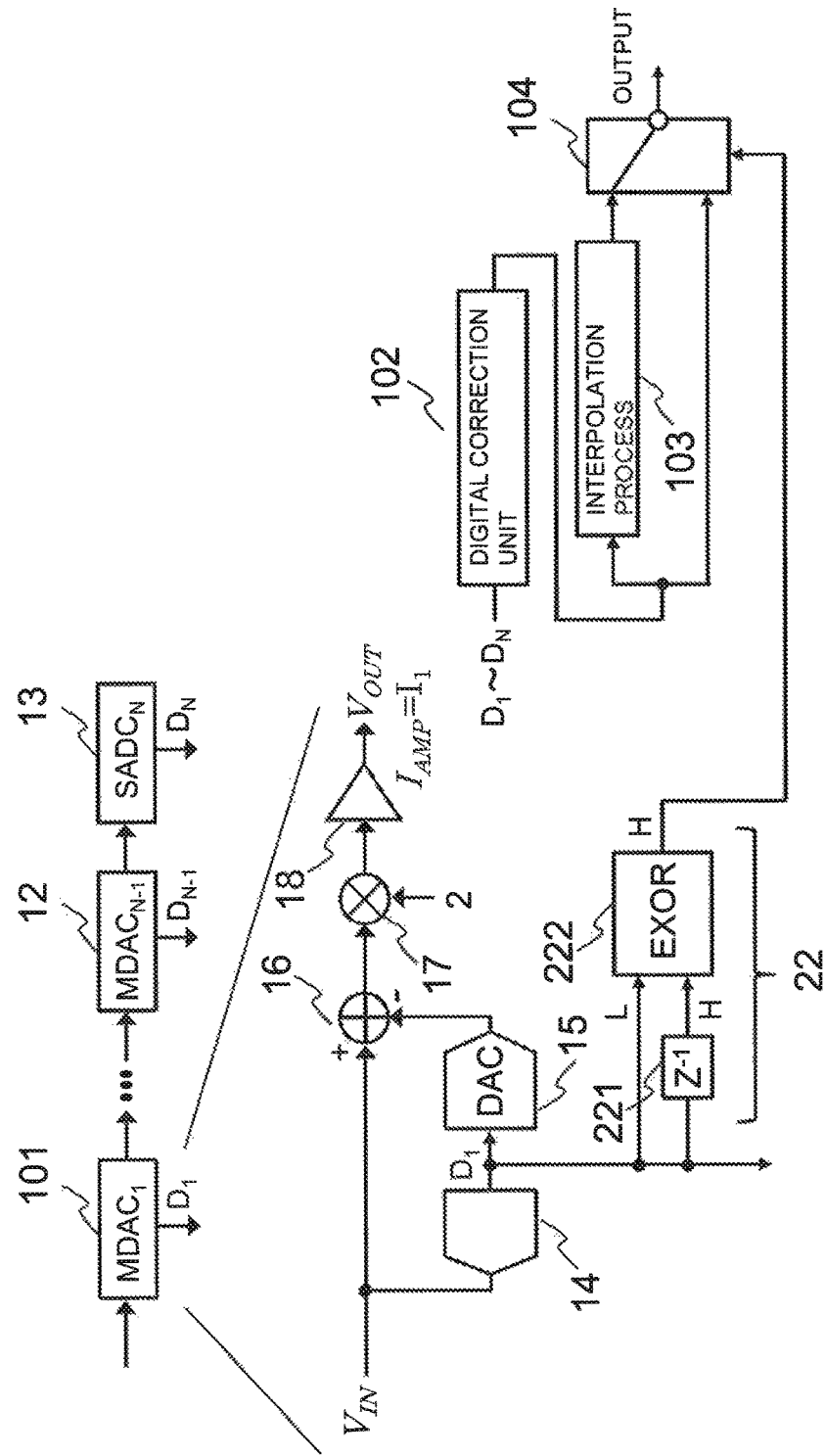
FIG. 10 is a circuit block diagram according to an eighth embodiment.

An eighth embodiment of the present embodiment will be described with reference to FIG. 10. Unlike the previous embodiments, in the present embodiment, the current control of the buffer amplifier 18 is not performed and a small current value $I_1$ is always set to a bias current value. For that reason, the output of the buffer amplifier 18 cannot respond to a large change in the MDAC output voltage occurring at a timing when the input voltage of the MDAC crosses zero.

Therefore, in the present embodiment, the timing when the input voltage of the MDAC crosses zero is detected by the detection unit 22 as in the respective other embodiments, the conversion result for a sampling point corresponding to the timing when the input voltage of the MDAC crosses zero is not adopted, and instead, a value obtained by interpolation operation with the use of the conversion results for peripheral sampling points is adopted.

For that reason, the digital outputs $D_1$ to $D_N$ of the respective MDACs and the SADC 13 are digitally corrected by a digital correction unit 102, and then divided into a path that does not pass through an interpolation processing unit 103 that performs the interpolation operation and a path that does not pass through the interpolation processing unit 103. The selector 65 selects the path that does not pass through the interpolation processing unit 103 when the output of the detection unit 22 is L and selects the path that passes through the interpolation processing unit 103 when the output of the detection unit 22 is H.

Ninth Embodiment

Figure 11:
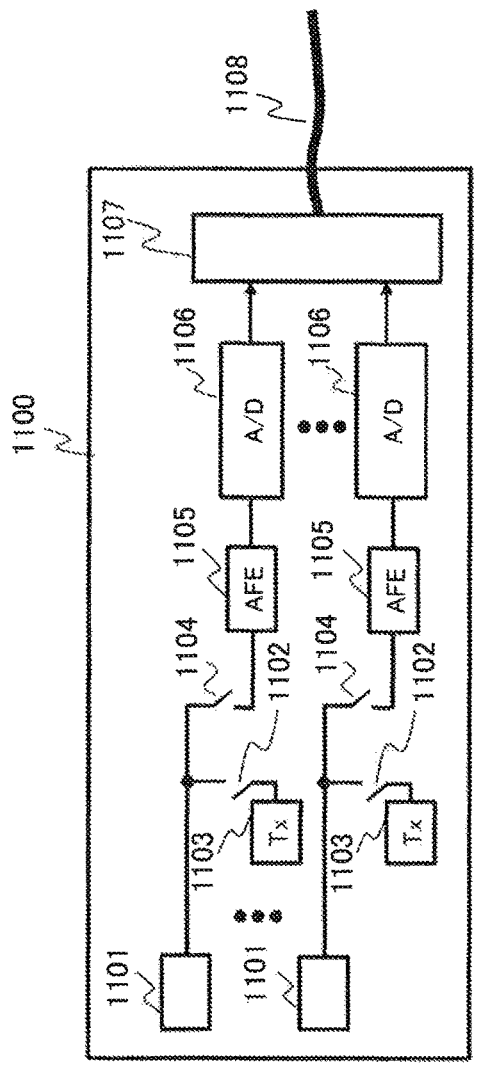
FIG. 11 is a circuit block diagram according to a ninth embodiment.

FIG. 11 shows a ninth embodiment of the present invention. The present embodiment shows a case where an analog-to-digital converter disclosed in the embodiments described above is applied to an ultrasonic diagnostic device probe 1100. A probe 1101 is connected with a transmission unit 1103 through a switch 1102. The probe 1101 is also connected to a receiving unit through a switch 1104. The receiving unit includes an analog front end circuit 1105 including an amplifier and a filter, and an analog-to-digital converter 1106.

The analog-to-digital converter 1106 can employ the analog-to-digital converter described in the first to ninth embodiments. The above configuration is provided for one transmitting and receiving channel, and the configuration is accumulated for the number of channels. The number of channels is 1000 or more. An output of the analog-to-digital converter 1106 in each channel is connected to a digital phasing unit 1107 and further connected to an ultrasonic diagnostic device main body as a digital signal through a digital cable 1108. The ultrasonic diagnostic device probe 1100 integrates the probes and components of the probes together.

The probe 1101 is a device for transmitting and receiving ultrasonic waves. In FIG. 11, two probes 1101 and circuits associated with those probes 1101 are shown in FIG. 11, but as described above, the ultrasonic diagnostic device probe 1100 is required to provide a large number of probes. For that reason, the number of analog-to-digital converters 1106 also increases. Since the ultrasonic diagnostic device probe 1100 may touch a human body at the time of diagnosis, it is important to reduce the power consumption of the analog-to-digital converter 1106 and to reduce heat generation.

At the time of transmission, the switch 1102 is turned on, a high voltage pulse generated by the transmission unit 1103 is transmitted to the probe 1101, and the probe 1101 converts the high voltage pulse into vibration and transmits the vibration as ultrasonic waves into a body. The ultrasonic waves reflected by an organ or the like in the body are received again by the probe 1101 and the vibration is converted into an electric signal. At the time of reception, the switch 1104 is turned on, and the converted electric signal is amplified by the analog front end circuit 1105 and then converted into a digital signal by the analog-to-digital converter 1106. Such operation is performed in each channel, and the digital phasing unit 1107 performs a delay addition process on the analog-to-digital conversion output of each channel, to thereby obtain in-vivo information and reduce the amount of data.

With the low power analog-to-digital converter of the present embodiment, it is considered that 1000 or more channels can be integrated together from the viewpoints of sizes and heat generation The analog-to-digital converters can be integrated for all of the channels, thereby being capable of digitalizing the probe output and also reducing data. As a result, a weight of the cable required for transmission to the main body device can be dramatically reduced, or wirelessly transmission from the probe to the main body device can be performed.

The present invention is not limited to the respective embodiments described above, and includes various modifications. For example, a part of one configuration example can be replaced with another configuration example, and the configuration of one embodiment can be added with the configuration of another embodiment. Also, in a part of the respective configuration examples, another configuration can be added, deleted, or replaced.

What is claims is:

1. An analog-to-digital converter, comprising a first circuit and a second circuit,
   wherein the first circuit includes a first quantizer that digitizes an input first analog voltage, has a function of subtracting an analog voltage generated based on the digitalized first value from the first analog voltage, has a function of amplifying a first analog residual voltage which is a result of the subtraction, and a first output drive amplifier that outputs the amplified first analog residual voltage,
   the second circuit includes a second quantizer that digitizes an input second analog voltage, has a function of subtracting an analog voltage generated based on the digitalized second value from the second analog voltage, has a function of amplifying a second analog residual voltage which is a result of the subtraction, and a second output drive amplifier that outputs the amplified second analog residual voltage, and
   the first circuit further includes a first detection control circuit, and the first detection control circuit detects a change in the digitalized first value, and increases a bias current of the first output drive amplifier at a timing of detecting the change.

2. The analog-to-digital converter according to claim 1, wherein the second circuit further includes a second detection control circuit, and the second detection control circuit detects a change in the digitalized second value, and increases a bias current of the second output drive amplifier at a timing of detecting the change.

3. The analog-to-digital converter according to claim 1, wherein the bias current of the second output drive amplifier is increased at a timing of detecting the change in the digitalized first value.

4. The analog-to-digital converter according to claim 1, wherein the first quantizer is a positive-negative determination unit.

5. The analog-to-digital converter according to claim 1, wherein the first quantizer is a ternary quantizer.

6. The analog-to-digital converter according to claim 1, wherein the first quantizer is a quaternary quantizer.

7. The analog-to-digital converter according to claim 1, wherein the first output drive amplifier is a source follower circuit.

8. The analog-to-digital converter according to claim 1, wherein the first output drive amplifier is an operational amplifier feedback circuit.

9. The analog-to-digital converter according to claim 1, further comprising a band-variable low-pass filter in a first stage,
   wherein a band of the low-pass filter is set according to a band control signal, and the bias current of the first output drive amplifier is variably set according to the band control signal.

10. The analog-to-digital converter according to claim 1, further comprising a first digital correction unit and a second digital correction unit,
    wherein the first digital correction unit performs digital correction on a conversion result when the bias current of the first output drive amplifier is a first current value, and
    the second digital correction unit performs digital correction on the conversion result when the bias current of the first output drive amplifier is a second current value.

11. An analog-to-digital converter, comprising a first circuit and a second circuit,
    wherein the first circuit includes a first quantizer that digitizes an input first analog voltage, has a function of subtracting an analog voltage generated based on the digitalized first value from the first analog voltage, has a function of amplifying a first analog residual voltage which is a result of the subtraction, and a first output drive amplifier that outputs the amplified first analog residual voltage,
    the second circuit includes a second quantizer that digitizes an input second analog voltage, has a function of subtracting an analog voltage generated based on the digitalized second value from the second analog voltage, has a function of amplifying a second analog residual voltage which is a result of the subtraction, and a second output drive amplifier that outputs the amplified second analog residual voltage, and the first circuit further includes a first detection control circuit, and the first detection control circuit detects a change in the digitalized first value, and replaces a conversion result at a sampling point corresponding to the timing of detecting the change with a value interpolated by using a conversion result at a surrounding sampling point.

12. A probe for an ultrasonic diagnostic device which converts a received acoustic wave signal into an electric signal and outputs the electric signal as a digital signal, comprising a plurality of channels, each of which includes a probe that receives the acoustic wave signal and converts the received acoustic wave signal into an analog electric signal, an analog front end circuit that processes the analog electric signal, and an analog-to-digital converter that converts the analog electric signal into a digital electric signal,
wherein each of the analog-to-digital converters includes a first circuit and a second circuit,
the first circuit includes a first quantizer that digitizes an input first analog voltage, a first subtraction circuit that subtracts an analog voltage generated based on the digitalized first value from the first analog voltage, and a first amplifier that amplifies an output of the first subtraction circuit and outputs the amplified output as a second analog voltage,
the second circuit includes a second quantizer that digitizes the input second analog voltage, a second subtraction circuit that subtracts an analog voltage generated based on the digitalized second value from the second analog voltage, and a second amplifier that amplifies an output of the second subtraction circuit and outputs the amplified output,
the first circuit further includes a first detection control circuit that detects a timing of changing the digitalized first value, and
the probe includes at least one of a current control function of increasing a current to be supplied to the first amplifier based on the timing and a result replacement function of replacing an analog-to-digital conversion result with another based on the timing.

13. The probe for an ultrasonic diagnostic device according to claim 12,
wherein the current control function changes a bias current of the first amplifier from a first current value to a second current value larger than the first current value based on an output of the first detection control circuit.

14. The probe for an ultrasonic diagnostic device according to claim 13,
wherein the second circuit further includes a second detection control circuit that detects a timing of changing the digitalized second value, and
the second circuit changes a bias current of the second amplifier from a third current value to a fourth current value larger than the third current value based on an output of the second detection control circuit.

15. The probe for an ultrasonic diagnostic device according to claim 12,
wherein the result replacement function outputs a value interpolated based on the analog-to-digital conversion result at a timing avoiding the timing of changing the digitalized first value as an analog-to-digital conversion result instead of the analog-to-digital conversion result generated according to the digitalized first value and the digitalized second value, based on the output of the first detection control circuit.

* * * * *